(12) United States Patent
Tu et al.

(10) Patent No.: US 10,629,509 B2
(45) Date of Patent: Apr. 21, 2020

(54) REDISTRIBUTION CIRCUIT STRUCTURES AND METHODS OF FORMING THE SAME

(71) Applicant: Taiwan Semiconductor Manufacturing Co., Ltd., Hsinchu (TW)

(72) Inventors: Shang-Yun Tu, Hsinchu (TW); Ching-Wen Hsiao, Hsinchu (TW); Sheng-Yu Wu, Hsinchu (TW); Ching-Hui Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 90 days.

(21) Appl. No.: 15/877,328

(22) Filed: Jan. 22, 2018

(65) Prior Publication Data

US 2019/0131200 A1    May 2, 2019

Related U.S. Application Data

(60) Provisional application No. 62/579,824, filed on Oct. 31, 2017.

(51) Int. Cl.
*H01L 21/66* (2006.01)
*H01L 25/00* (2006.01)
(Continued)

(52) U.S. Cl.
CPC ........ *H01L 23/3128* (2013.01); *H01L 21/563* (2013.01); *H01L 21/565* (2013.01); *H01L 21/6835* (2013.01); *H01L 21/76843* (2013.01); *H01L 21/78* (2013.01); *H01L 22/20* (2013.01); *H01L 22/32* (2013.01); *H01L 23/3114* (2013.01); *H01L 23/49838* (2013.01); *H01L 24/03* (2013.01); *H01L 24/19* (2013.01); *H01L 24/20* (2013.01); *H01L 24/97* (2013.01); *H01L 25/105* (2013.01); *H01L 25/50* (2013.01); *H01L 21/561* (2013.01); *H01L 25/0657* (2013.01); *H01L 2221/68345* (2013.01);
(Continued)

(58) Field of Classification Search
CPC . H01L 23/3128; H01L 21/563; H01L 21/565; H01L 21/6835; H01L 21/76843; H01L 21/78; H01L 22/20
USPC ...................................................... 257/738
See application file for complete search history.

(56) References Cited

U.S. PATENT DOCUMENTS 9,000,584 B2  4/2015  Lin et al.
9,048,222 B2  6/2015  Hung et al.
(Continued)

*Primary Examiner* — Elias Ullah
(74) *Attorney, Agent, or Firm* — JCIPRNET

(57) ABSTRACT

Redistribution circuit structures and methods of forming the same are disclosed. One of the redistribution circuit structures includes a first conductive structure, a dielectric layer and a second conductive structure. The dielectric layer is disposed over and exposes a portion of the first conductive structure. The second conductive structure is disposed in the dielectric layer to electrically connect to the first conductive structure, and includes a first conductive layer and a second conductive layer disposed on and electrically connected to the first conductive layer. The first conductive layer includes a main portion and a conductive protrusion, the conductive protrusion is disposed on an entire edge of an upper surface of the main portion, and a top of the conductive protrusion is higher than the upper surface of the main portion.

20 Claims, 15 Drawing Sheets

(51) Int. Cl.
    *H01L 23/31* (2006.01)
    *H01L 23/00* (2006.01)
    *H01L 21/56* (2006.01)
    *H01L 21/768* (2006.01)
    *H01L 21/78* (2006.01)
    *H01L 23/498* (2006.01)
    *H01L 21/683* (2006.01)
    *H01L 25/10* (2006.01)
    *H01L 25/065* (2006.01)

(52) U.S. Cl.
    CPC ........... *H01L 2221/68359* (2013.01); *H01L 2224/214* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/15311* (2013.01)

(56) References Cited

U.S. PATENT DOCUMENTS

| | | | |
|---|---|---|---|
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2013/0146872 A1* | 6/2013 | Chen | H01L 22/12 257/48 |

* cited by examiner

REDISTRIBUTION CIRCUIT STRUCTURES AND METHODS OF FORMING THE SAME

CROSS-REFERENCE TO RELATED APPLICATION

This application claims the priority benefit of U.S. provisional application Ser. No. 62/579,824, filed on Oct. 31, 2017. The entirety of the above-mentioned patent application is hereby incorporated by reference herein and made a part of this specification.

BACKGROUND

During the manufacture of integrated circuits (ICs), multi-step sequences of semiconductor manufacturing processes are performed to gradually form electronic circuits on semiconductor workpieces. One such semiconductor manufacturing process is lithography. Lithography is a process for transferring a geometric pattern to semiconductor workpieces. Lithography may be performed by, for example, photolithography, charged particle lithography, or nanoimprint lithography.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
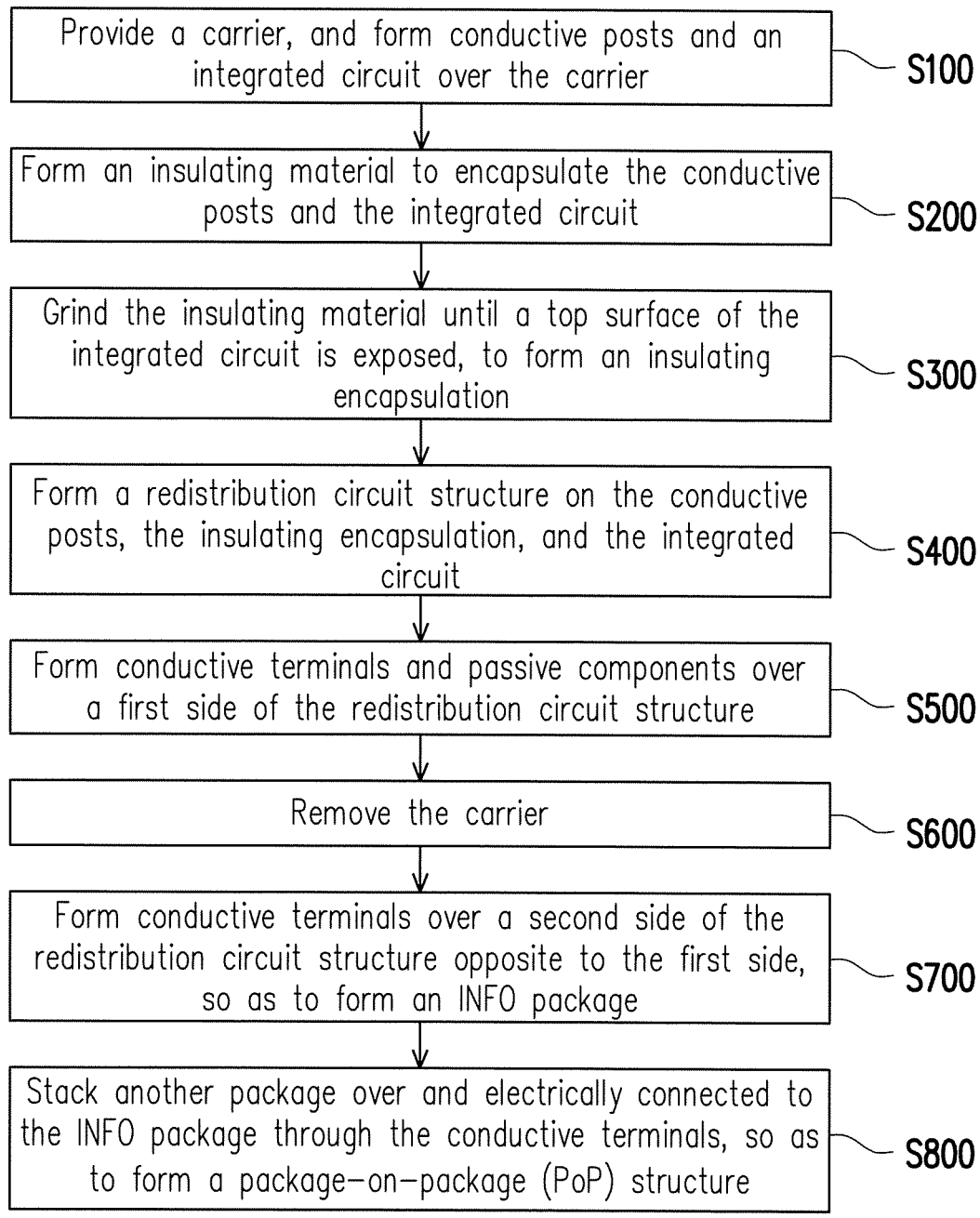
FIG. 1 illustrates a flow chart illustrating a method of forming an INFO package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending over the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2A:
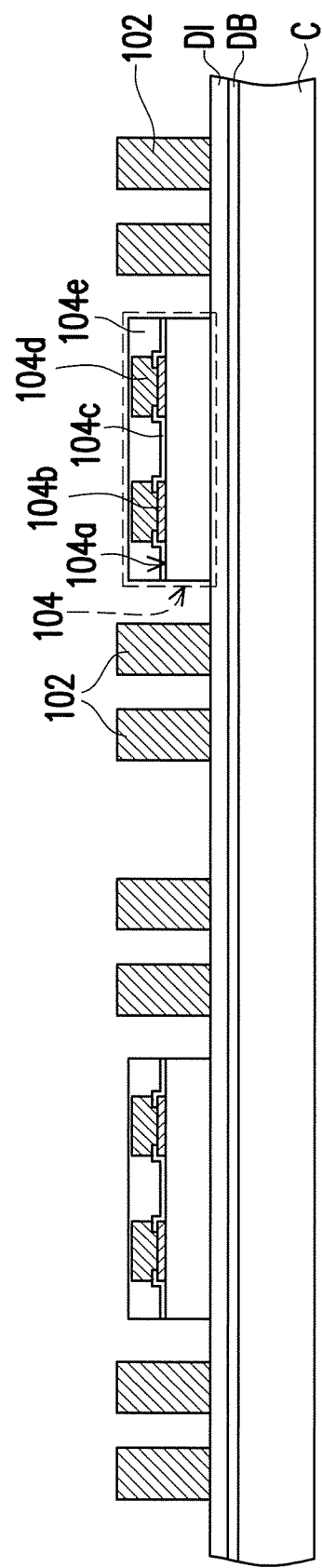
FIGS. 2A-2G are schematic cross-sectional views illustrating a manufacturing process of an integrated fan-out (INFO) package in accordance with some embodiments of the disclosure.

FIG. 1 illustrates a flow chart illustrating a method of forming an INFO package in accordance with some embodiments of the present disclosure. FIGS. 2A-2G are schematic cross-sectional views illustrating a manufacturing process of an integrated fan-out (INFO) package in accordance with some embodiments of the disclosure. Referring to FIGS. 1 and 2A, at step S100, a carrier C is provided, and conductive posts 102 and an integrated circuit 104 are formed over the carrier C. A de-bonding layer DB and a dielectric layer DI are stacked over the carrier C in sequential order. In some embodiments, the de-bonding layer DB is formed on the upper surface of the carrier C, and the de-bonding layer DB is between the carrier C and the dielectric layer DI. The carrier C is, for example, a glass substrate. On the other hand, in some embodiments, the de-bonding layer DB is a light-to heat-conversion (LTHC) release layer formed on the glass substrate. In some embodiments, the dielectric layer DI is, for example, polymer such as polyimide, benzocyclobutene (BCB), polybenzoxazole (PBO), or the like. In some alternative embodiments, the dielectric layer DI may include non-organic dielectric materials such as silicon oxide, silicon nitride, silicon carbide, silicon oxynitride, or the like. However, the materials of the de-bonding layer DB, the carrier C, and the dielectric layer DI are merely for illustration, and the disclosure is not limited thereto.

A plurality of pre-fabricated conductive posts 102 and a plurality of pre-fabricated integrated circuits 104 are provided over the dielectric layer DI. The integrated circuits 104 are mounted onto the dielectric layer DI having the conductive posts 102 formed thereon. A die attach film (DAF) (not illustrated) is locate between the integrated circuits 104 and the dielectric layer DI for adhering the integrated circuits 104 onto the dielectric layer DI. The integrated circuits 104 are arranged in an array and are surrounded by the conductive posts 102. The integrated circuits 104 are, for example, semiconductor dies. Each of the integrated circuits 104 includes an active surface 104a, a plurality of pads 104b distributed on the active surface 104a, a passivation layer 104c covering the active surface 104a, a plurality of conductive pillars 104d, and a protection layer 104e. The pads 104b are partially exposed by the passivation layer 104c, the conductive pillars 104d are disposed on and electrically connected to the pads 104b, and the protection layer 104e covers the conductive pillars 104d and the passivation layer 104c. The conductive pillars 104d are copper pillars or other suitable metal pillars, for example. In some embodiments, the protection layer 104e may be a polybenzoxazole (PBO) layer, a polyimide (PI) layer or other suitable polymers. In some alternative embodiments, the protection layer 104e may be made of inorganic materials. As illustrated in FIG. 2A, the top surfaces of the integrated circuits 104 are lower than the top surfaces of the conductive posts 102. However, the disclosure is not limited thereto. In some alternative embodiments, the top surfaces of the integrated circuits 104 may be substantially coplanar with the top surfaces of the conductive posts 102.

Figure 2B:
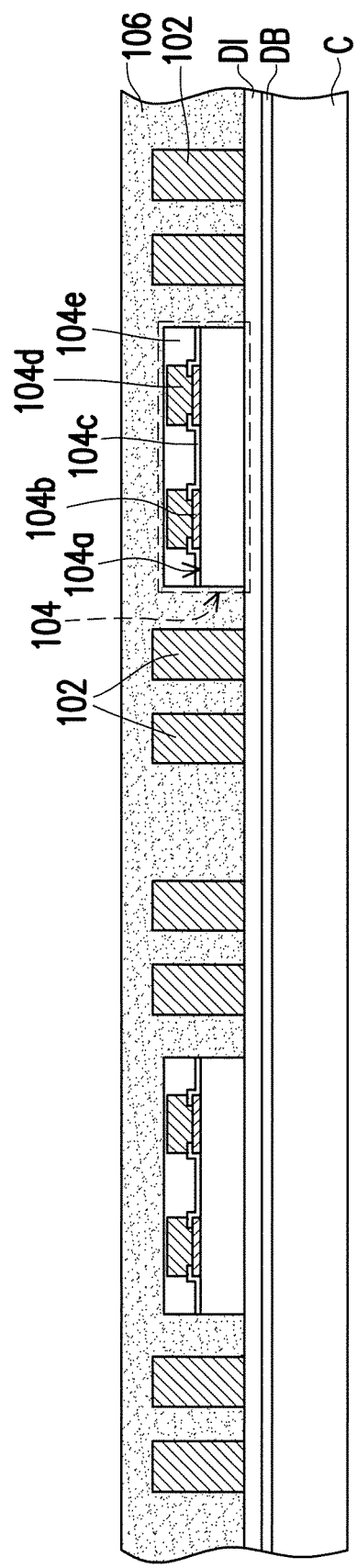

Referring to FIGS. 1 and 2B, at step S200, an insulating material 106 is formed to encapsulate the conductive posts 102 and the integrated circuit 104. In some embodiments, the insulating material 106 is a molding compound formed on the dielectric layer DI by a molding process. The conductive posts 102 and the protection layer 104e of the integrated circuits 104 are encapsulated by the insulating material 106. In other words, the conductive posts 102 and the protection layer 104e of the integrated circuits 104 are not revealed and are well protected by the insulating material 106. In some embodiments, the insulating material 106 may include epoxy or other suitable materials.

Figure 2C:
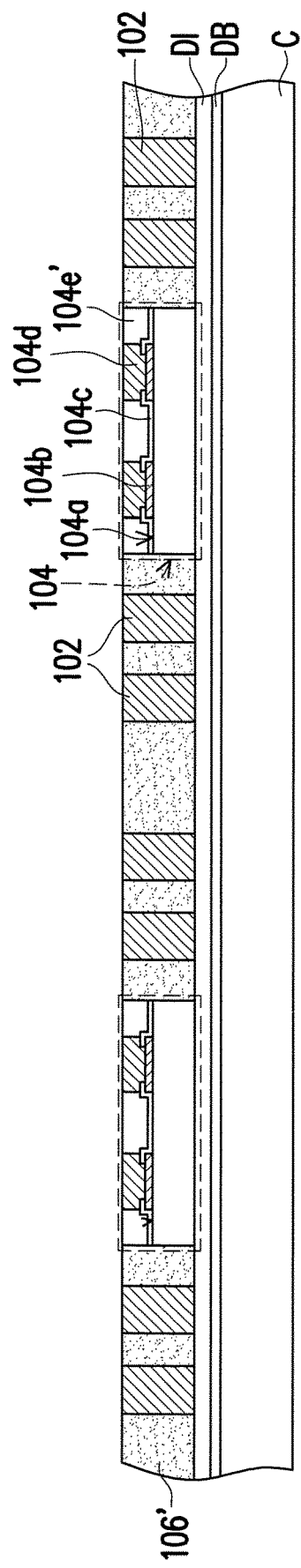

Referring to FIGS. 1 and 2C, at step S300, the insulating material 106 is grinded until a top surface of the integrated circuit 104 is exposed, to form an insulating encapsulation 106'. In some embodiments, the insulating material 106 and the protection layers 104e of the integrated circuits 104 are grinded until the top surfaces of the conductive pillars 104d are exposed. After the insulating material 106 is grinded, an insulating encapsulation 106' is formed over the dielectric layer DI. During the aforementioned grinding process, portions of the protection layer 104e are also grinded to form a protection layer 104e'. In some embodiments, during the aforementioned grinding process of the insulating material 106 and the protection layer 104e, portions of the conductive pillars 104d and portions of the conductive posts 102 are grinded until the top surfaces of the conductive pillars 104d and the top surfaces of the conductive posts 102 are exposed. In other words, the insulating encapsulation 106' exposes at least part of the integrated circuits 104 and at least part of the conductive posts 102. In some embodiments, the insulating encapsulation 106' may be formed by a mechanical grinding, a chemical mechanical polishing (CMP), or another suitable mechanism.

The insulating encapsulation 106' encapsulates the sidewalls of the integrated circuit 104, and the insulating encapsulation 106' is penetrated by the conductive posts 102. In other words, the integrated circuit 104 and the conductive posts 102 are embedded in the insulating encapsulation 106'. It should be noted that although the integrated circuits 104 and the conductive posts 102 are embedded in the insulating encapsulation 106', the insulating encapsulation 106' exposes top surfaces of the integrated circuits 104 and the conductive posts 102. In other words, the top surfaces of the conductive posts 102, the top surface of the protection layer 104e', and the top surfaces of the conductive pillar 104d are substantially coplanar with the top surface of the insulating encapsulation 106'.

Figure 2D:
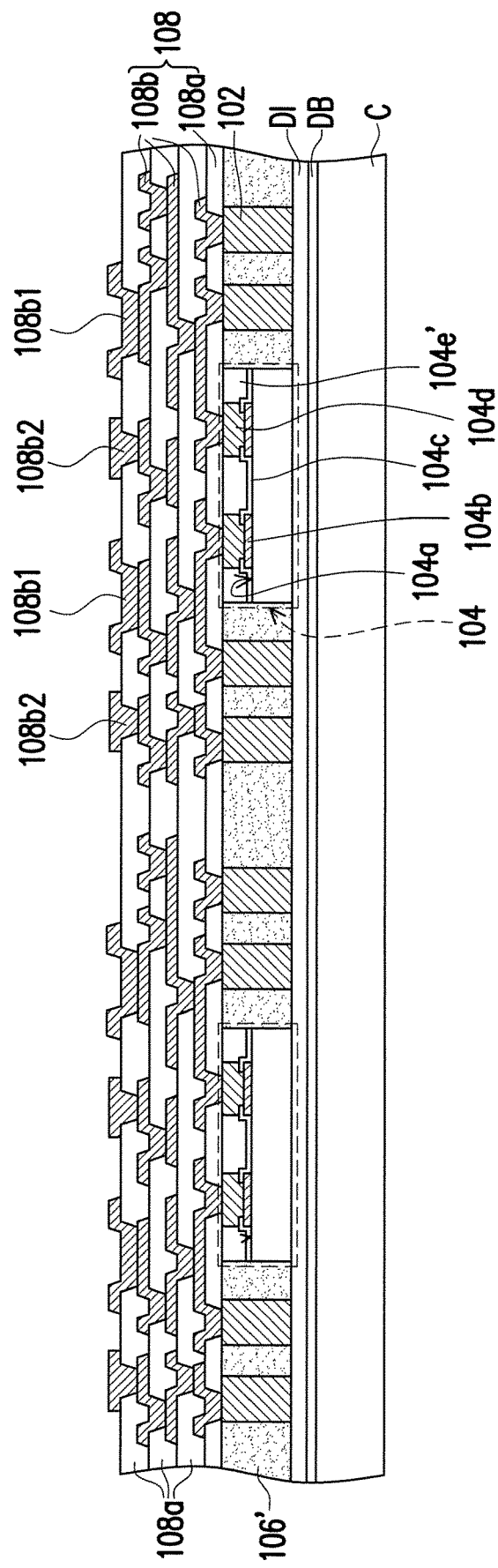
Figure 2E:
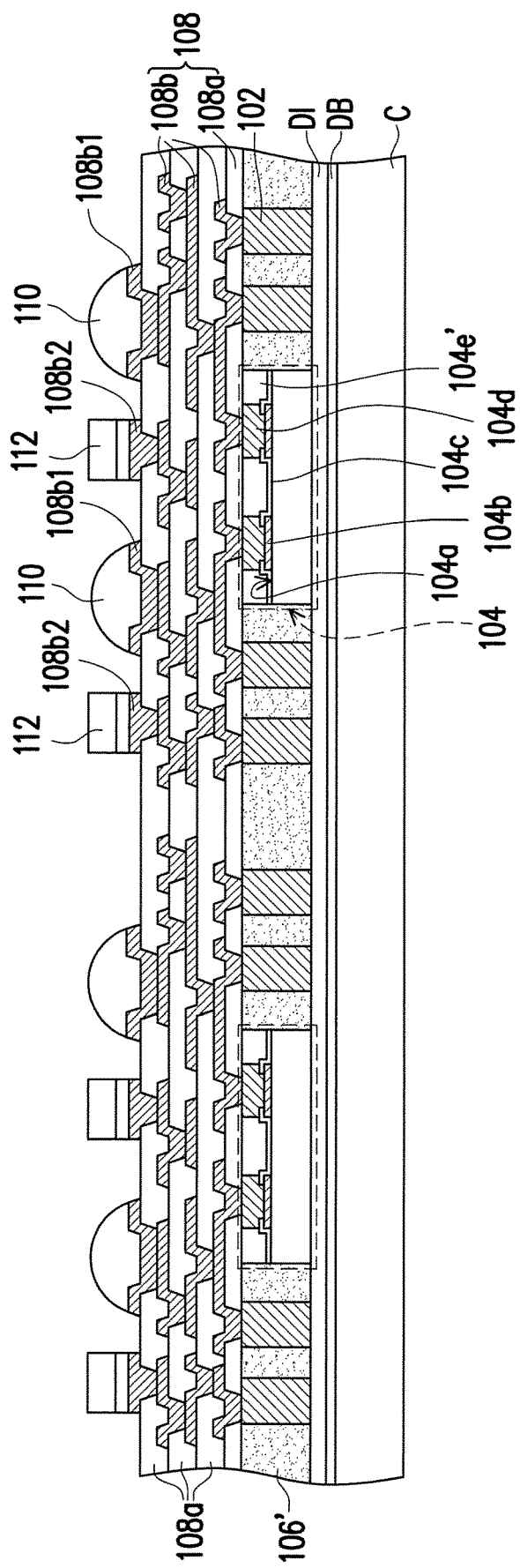

Referring to FIGS. 1 and 2D, at step S400, a redistribution circuit structure 108 is formed on the conductive posts 102, the insulating encapsulation 106', and the integrated circuit 104. In some embodiments, after the insulating encapsulation 106' and the protection layer 104e' are formed, the redistribution circuit structure 108 electrically connected to the conductive pillars 104d of the integrated circuit 104 and the conductive posts 102 is formed on the top surfaces of the conductive posts 102, the top surface of the insulating encapsulation 106', the top surfaces of the conductive pillars 104d, and the top surface of the protection layer 104e'. As shown in FIG. 2D, the redistribution circuit structure 108 includes a plurality of inter-dielectric layers 108a and a plurality of redistribution conductive patterns 108b stacked alternately. The redistribution conductive patterns 108b are electrically connected to the conductive pillars 104d of the integrated circuits 104 and the conductive posts 102 embedded in the insulating encapsulation 106'. In some embodiments, the top surfaces of the conductive pillars 104d and the top surfaces of the conductive posts 102 are in contact with the bottommost redistribution conductive patterns 108b of the redistribution circuit structure 108. The top surfaces of the conductive pillars 104d and the top surfaces of the conductive posts 102 are partially covered by the bottommost inter-dielectric layer 108a. Furthermore, the topmost redistribution conductive patterns 108b include a plurality of pads. In some embodiment the aforementioned pads include a plurality of under-ball metallurgy (UBM) patterns 108b1 for ball mount and/or at least one connection pads 108b2 for mounting of passive components. The number of the under-ball metallurgy patterns 108b1 and the connection pad 108b2 is not limited in this disclosure.

Figure 3:
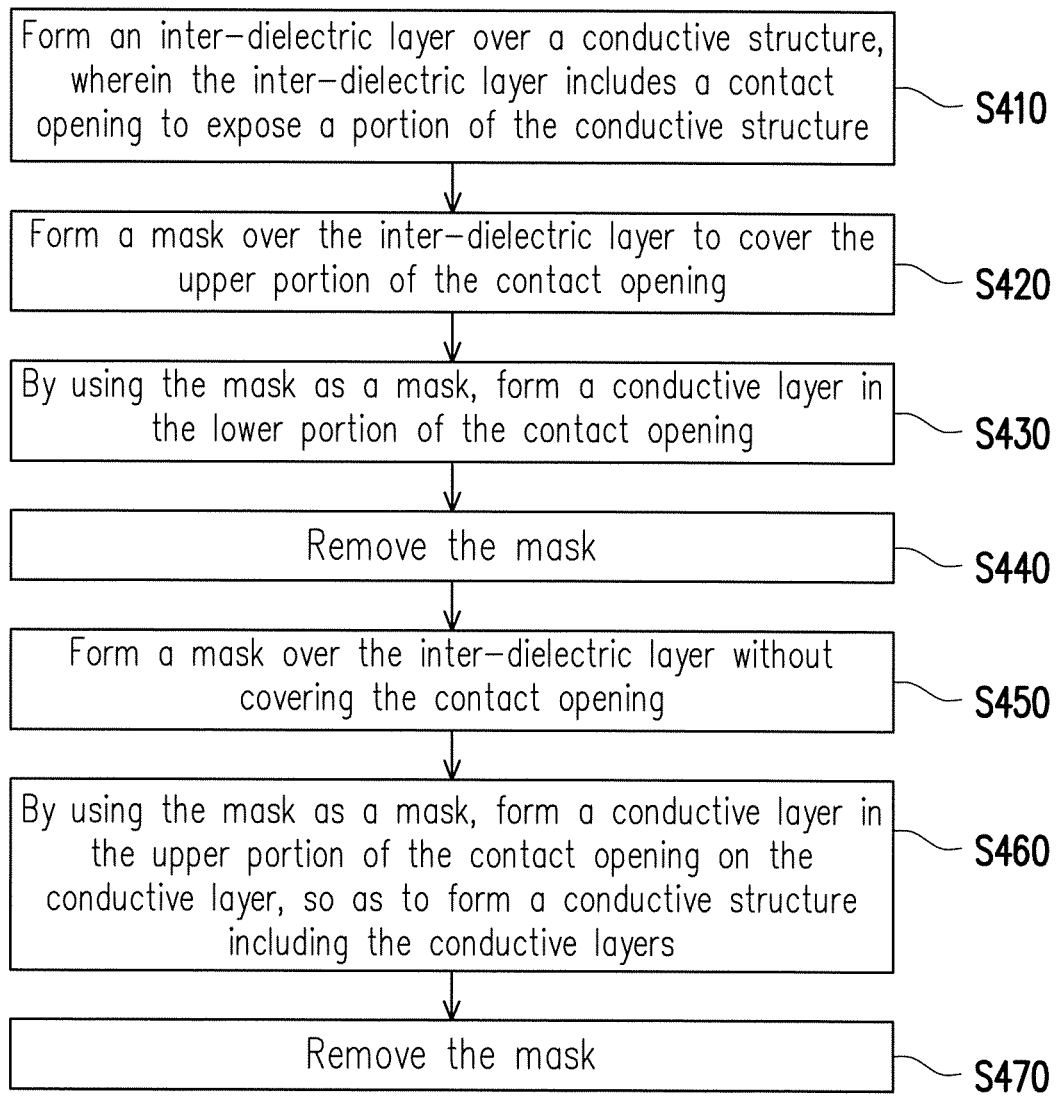
FIG. 3 illustrates a flow chart illustrating a method of forming a redistribution circuit structure in accordance with some embodiments of the present disclosure.

The detailed formation method of at least a portion of the redistribution circuit structure 108 will be presented below. FIG. 3 illustrates a flow chart illustrating a method of forming a redistribution circuit structure in accordance with some embodiments of the present disclosure. FIGS. 4A-4H are cross-sectional views illustrating a manufacturing process of the redistribution circuit structure 108 depicted in FIG. 2D, in accordance with some embodiments of the disclosure. It should be noted that the illustrations depicted in FIGS. 4A-4H merely serve as examples for demonstration. As such, scales, dimensions, and shapes illustrated in FIGS. 4A-4H may not completely reflect the redistribution circuit structure 108 illustrated in FIG. 2D. However, same elements are denoted by the same reference numeral to establish a correlation between FIGS. 4A-4H and FIG. 2D.

Figure 4A:
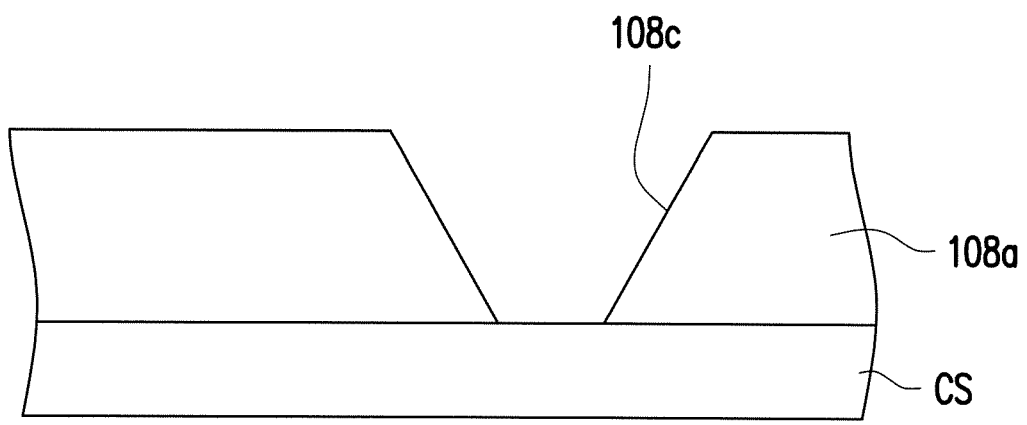
FIGS. 4A-4H are cross-sectional views illustrating a manufacturing process of the redistribution circuit structure depicted in FIG. 2D, in accordance with some embodiments of the disclosure.

Referring to FIGS. 3 and 4A, at step S410, an inter-dielectric layer 108a is formed over a conductive structure CS, wherein the inter-dielectric layer 108a includes a contact openings 108c to expose a portion of the conductive structure CS. In some embodiments, the conductive structure CS may be one of the redistribution conductive patterns 108b. However, the disclosure is not limited thereto. In some alternative embodiments, the inter-dielectric layer 108a may be the bottommost inter-dielectric layer 108a, and the conductive structure CS may be the conductive post 102 or the conductive pillar 104d. In some embodiments, as illustrate in FIG. 2D, a plurality of contact openings 108c are formed in the inter-dielectric layer 108a so as to render electrical connection between the conductive structure CS and the subsequently formed conductive materials. In some embodiments, the inter-dielectric layer 108a may be a single-layered structure or a multi-layered structure. The inter-dielectric layer 108a may have a thickness of approximately 10 µm to approximately 30 µm.

Figure 4B:
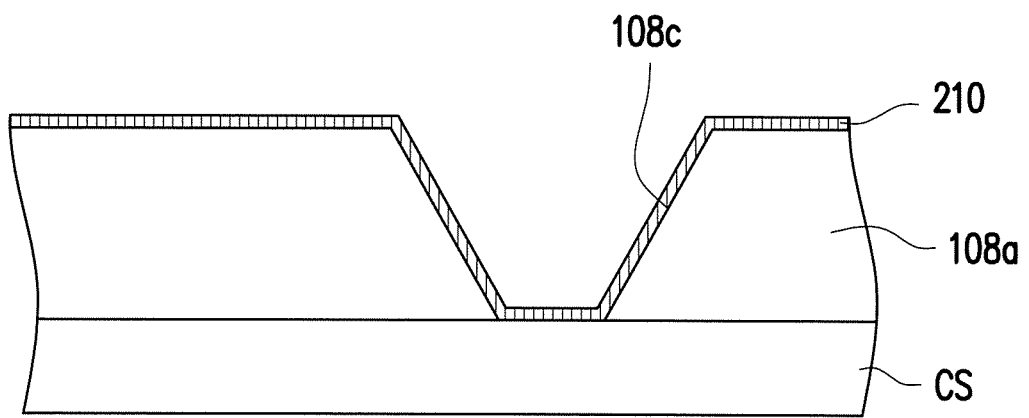

Referring to FIG. 4B, a barrier layer 210 is formed over the inter-dielectric layer 108a. In some embodiments, the barrier layer 210 is conformally disposed over the inter-dielectric layer 108a. That is, the barrier layer 210 extends into the contact opening 108c to cover a bottom surface and a sidewall of the contact opening 108c. The barrier layer 210 may comprise, for example, titanium, titanium nitride, tantalum, tantalum nitride, other suitable materials, or combinations thereof. In some embodiments, the barrier layer 210 is formed by physical vapor deposition or other applicable methods. The barrier layer 210 may have a thickness of approximately 0.01 µm to approximately 1 µm. In some alternative embodiments, the barrier layer 210 may be omitted.

Figure 4C:
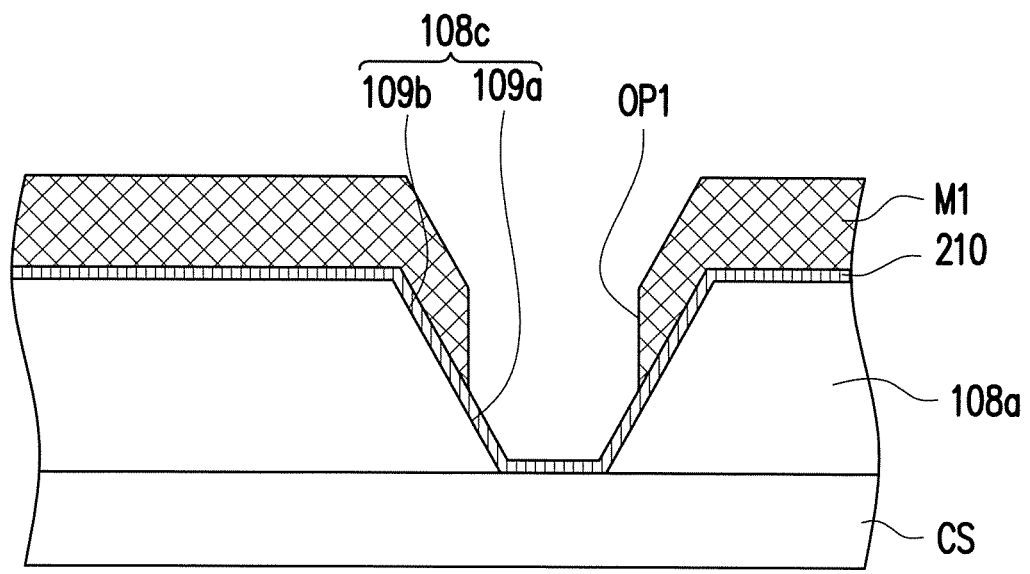

Referring to FIGS. 3 and 4C, at step S420, a mask M1 is formed over the inter-dielectric layer 108a to cover an upper portion 109b of the contact opening 108c. In some embodiments, the mask M1 is formed on the barrier layer 210 to cover the upper portion 109b of the contact opening 108c, and has an opening OP1 corresponding to a lower portion 109a of the contact opening 108c. As mentioned above, the barrier layer 210 is disposed conformally into the contact opening 108c, and thus the opening OP1 exposes at least part of the barrier layer 210 over the lower portion 109a of the contact opening 108c. In some embodiments, the mask M1 may be formed by a photo resist or a dry film.

Figure 4D:
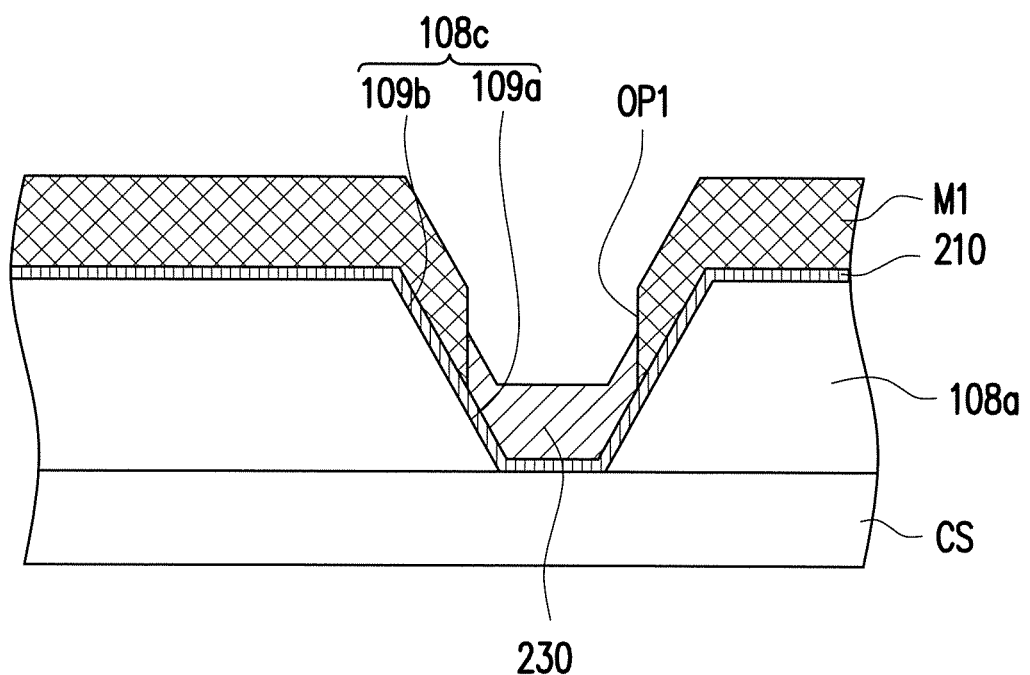

Referring to FIGS. 3 and 4D, at step S430, by using the mask M1 as a mask, a conductive layer 230 is formed in the lower portion 109a of the contact opening 108c. In some embodiments, the conductive layer 230 is formed in the opening OP1 corresponding to the lower portion 109a of the contact opening 108c. In some embodiments, the conductive layer 230 may be formed by a plating process. The plating process is, for example, electro-plating, electroless-plating, immersion plating, or the like. The conductive material is, for example, copper, copper alloys, or the like. In some embodiments, a depth of the lower portion 109a is about half of a depth of the contact opening 108c, and the disclosure is not limited thereto. In some alternative embodiments, a seed layer may be formed between the barrier layer 210 and the conductive layer 230.

Figure 4E:
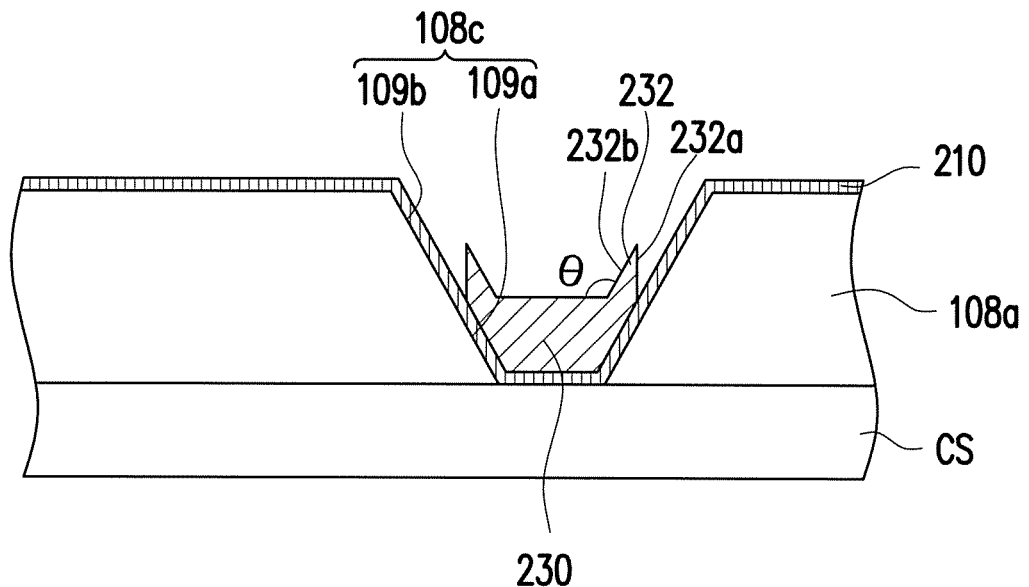

Referring to FIGS. 3 and 4E, at step S440, after forming the conductive layer 230, the mask M1 is removed. In some embodiments, the conductive layer 230 includes an upper surface with a protrusion 232 at an entire edge. For example, an outside wall 232a of the protrusion 232 is substantially vertical to an exposed surface of the conductive structure CS. In some embodiments, an included angle θ between the upper surface of the conductive layer 230 and an inside wall 232b of the protrusion 232 is an obtuse angle, for example. In some embodiments, a cross-sectional view thereof is a triangle. However, the disclosure is not limited thereto. In other words, the conductive layer 230 may have other profile, which substantially corresponds to a profile of the opening OP1 of the mask M1. For example, in alternative some embodiments, the protrusion 232 may have a flat upper surface, and a cross-sectional view thereof is a trapezoid. In alternative some embodiments, the protrusion 232 may have a rounded upper surface. In some embodiments, the mask M1 is removed by a stripping method.

Figure 4F:
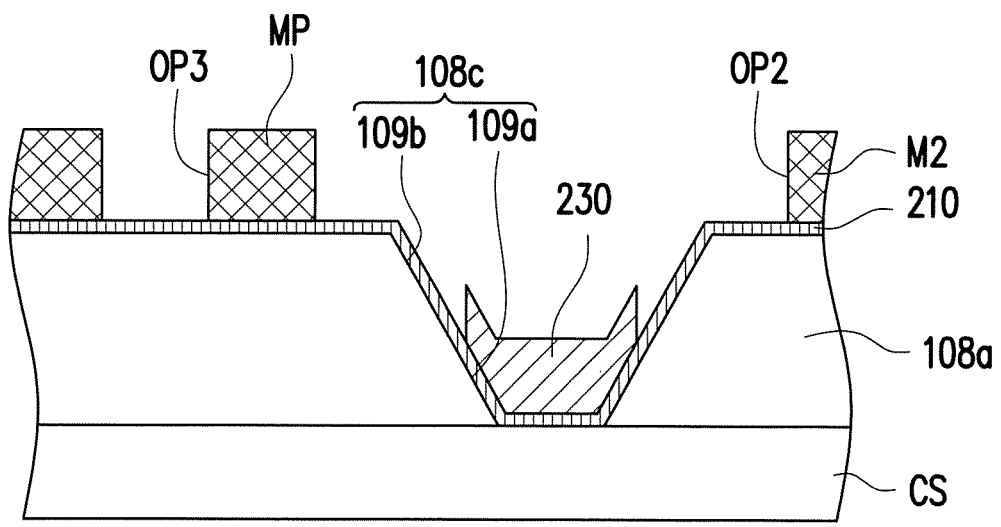

Referring to FIGS. 3 and 4F, at step S450, a mask M2 is formed over the inter-dielectric layer 108a without covering the contact opening 108c. The mask M2 is patterned to render an opening OP2, which corresponding to the contact opening 108c. In some embodiments, the opening OP2 exposes the conductive layer 230 in the lower portion 109a of the contact opening 108c and the barrier layer 210 in the upper portion 109b of the contact opening 108c. In some embodiments, the mask M2 may further include a plurality of patterns MP and at least one opening OP3 between the adjacent patterns MP over the inter-dielectric layer 108a, and thus the openings OP3 further expose a portion of the barrier layer 210 over the inter-dielectric layer 108a. Moreover, a width of the pattern MP of the mask M2 and a width of the opening OP3 of the mask M2 over the inter-dielectric layer 108a may be respectively not larger than 10 µm, for example. In some embodiments, the mask M2 may be formed by a photo resist or a dry film. In some embodiments, a depth of the upper portion 109b is substantially equal to the depth of the lower portion 109a. In some embodiments, a depth of the upper portion 109b is about half of a depth of the contact opening 108c, and the disclosure is not limited thereto.

Figure 4G:
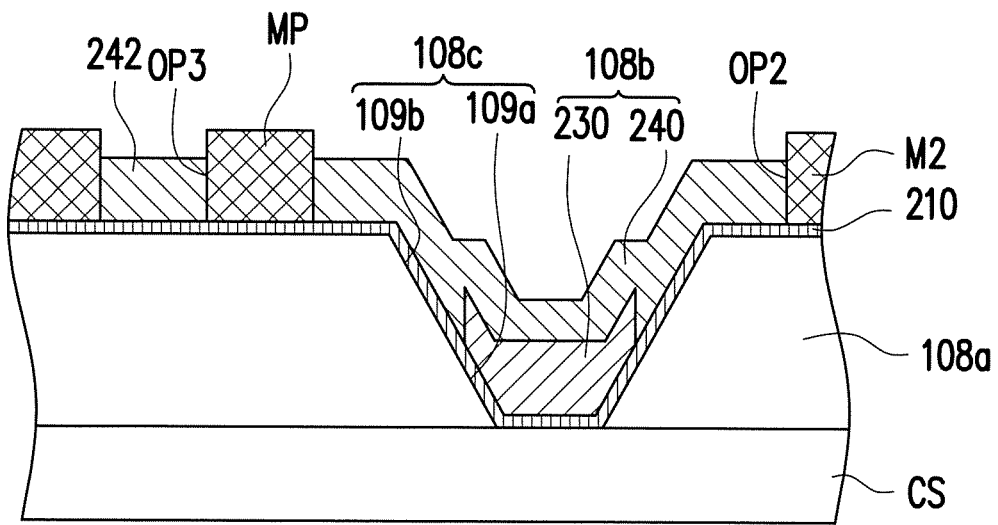

Referring to FIGS. 3 and 4G, at step S460, by using the mask M2 as a mask, a conductive layer 240 is formed in the upper portion 109b of the contact opening 108c on the conductive layer 230, so as to form a conductive structure including the conductive layers 230, 240. In some embodiments, a conductive material is formed to cover the conductive layer 230, so as to form the redistribution conductive pattern 108b. In some embodiments, the conductive material includes the conductive layer 240, and the conductive layer 240 is filled in the upper portion 109b of the contact opening 108c over the conductive layer 230 and extends over a portion of the inter-dielectric layer 108a. In some embodiments, the conductive layer 240 is conformally formed with the conductive layer 230 having the protrusion 232 at the edge and the upper portion 109b of the contact opening 108c. In addition, the conductive material may further include a conductive pattern 242 formed in the opening OP3. In some embodiments, a width of the conductive pattern 242 is not larger than 10 µm, for example. In some embodiments, the conductive layer 240 may be formed by a plating process. The plating process is, for example, electro-plating, electroless-plating, immersion plating, or the like. The conductive material is, for example, copper, copper alloys, or the like. The redistribution conductive patterns 108b includes the conductive layer 230 and the conductive layer 240, and an interface is formed between the conductive layer 230 and the conductive layer 240.

Figure 4H:
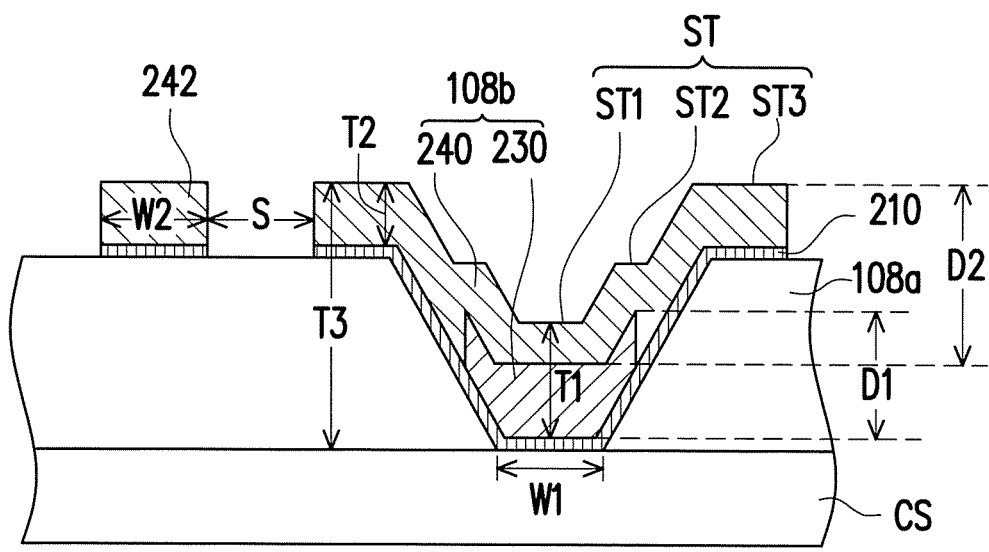

Referring to FIGS. 3 and 4H, at step S470, after forming the conductive layer 240, the mask M2 is subsequently removed. In some embodiments, the mask M2 is removed by a stripping method. Then, a portion of the barrier layer 210 is removed by using the conductive layer 240 and the conductive pattern 242 as a mask. In some embodiments, the barrier layer 210 is removed by a dry etching process or a wet etching process.

Figure 5:
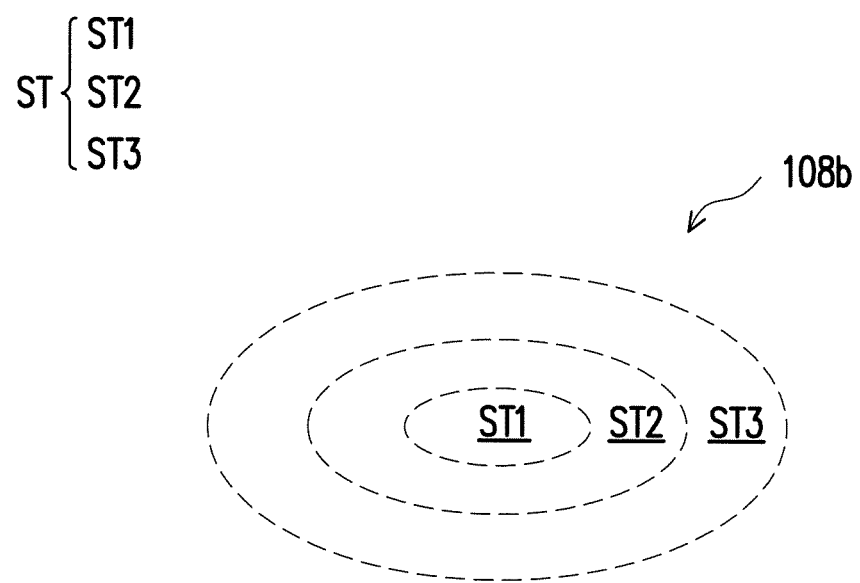
FIG. 5 is a top view illustrating the redistribution circuit structure depicted in FIG. 4H, in accordance with some embodiments of the disclosure.

In some embodiments, as shown in FIG. 4H, although a sidewall of the inter-dielectric layer 108a has no step structure, an upper surface of the redistribution conductive patterns 108b includes a step structure ST having three steps ST1, ST2, ST3. In addition, as shown in FIG. 5, since heights of the steps ST1, ST2, ST3 are difference, in a top view, the step structure ST includes three circles which respectively form by the steps ST1, ST2, ST3, and the disclosure is not limited thereto. In some alternative embodiments, when the conductive layer 230 further includes at least one recess in the upper surface, which means more than two different heights are created in the upper surface, the step structure ST of the redistribution conductive patterns 108b may have more than three steps, for example.

In some embodiments, a distance D1 from a lowest portion to a highest portion of the conductive layer 230 is substantially equal to a distance D2 from a lowest portion to a highest portion of the conductive layer 240. In some embodiments, a ratio of a thickness T1 from a bottom of the conductive layer 230 to a lowest upper surface of the conductive layer 240 to a thickness T2 of a portion of the conductive layer 240 extending over the inter-dielectric layer 108a is larger than 1.5, for example. In some embodiments, a thickness T2 of the conductive layer 240 is larger than 5 μm. In addition, a total thickness T3 of the inter-dielectric layer 108a and the conductive layer 240 thereon is two times larger than a width W1 of a portion of the conductive structure CS exposed by the inter-dielectric layer 108a. In some embodiments, a width W2 of the conductive pattern 242 is less than the width W1 of a portion of the conductive structure CS, and the width W2 of the conductive pattern 242 is substantially equal to a line spacing S between the conductive pattern 242 and the conductive layer 240 or between the adjacent conductive patterns 242. Generally, the aforementioned thickness, width or height of the elements may increase difficulty of landing a conductive pattern in the opening, which means a risk of under development is increased. However, in some embodiments, since the redistribution conductive pattern is formed by two deposition or plating processes, the difficulty of filling the conductive materials into a deep opening is reduced, and the resolution is improved. Accordingly, the window of the depth of focus (DOF) is enlarged. In addition, in some embodiments, line width and line spacing of the conductive pattern such as conductive pattern 242 are reduced, and thus an area for disposing the conductive pattern may be decreased. Accordingly, the performance of the redistribution circuit structure is improved.

In some embodiments, the redistribution circuit structure 108 is a single-layered structure. Thus, upon performing the steps illustrated in FIGS. 4A-4H, the redistribution circuit structure 108 is substantially completed. However, in some alternative embodiments, the redistribution circuit structure 108 is a multi-layered structure (for example, the redistribution circuit structure 108 illustrated in FIG. 2D). Under this condition, the steps illustrated in FIGS. 4A-4H may be repeated several times to render the redistribution circuit structure 108.

It should be noted that the steps illustrated in FIGS. 4A-4H are not limited to fabricating the redistribution circuit structure 108 depicted in FIG. 2D. The foregoing step may be utilized in redistribution circuit structures located at other positions in a package. For example, the foregoing steps may be employed in a redistribution circuit structures within an integrated circuit. In some alternative embodiments, the foregoing step may be utilized to manufacturing an UBM.

Referring back to FIGS. 1 and 2E, at step S500, conductive terminals 110 and passive components 112 are formed over a first side of the redistribution circuit structure 108. In some embodiments, after the redistribution circuit structure 108 is formed, a plurality of conductive terminals 110 are placed on the under-ball metallurgy patterns 108b1, and a plurality of passive components 112 are mounted on the connection pads 108b2. In some embodiments, the conductive terminals 110 may be placed on the under-ball metallurgy patterns 108b1 through a ball placement process or other suitable processes and the passive components 112 may be mounted on the connection pads 108b2 through a soldering process, a reflowing process, or other suitable processes.

Figure 2F:
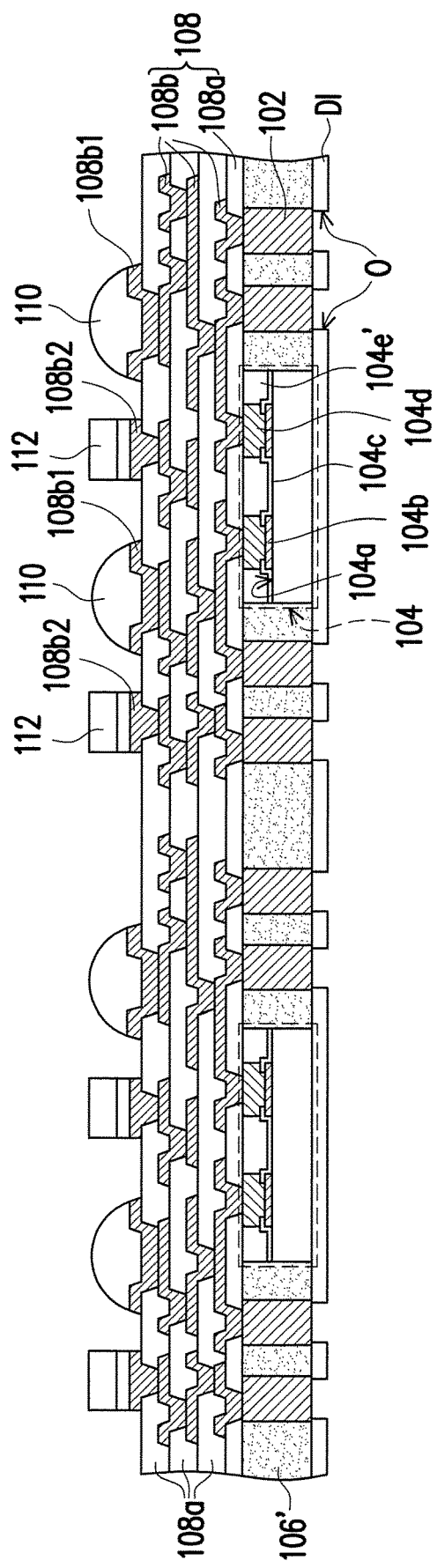

Referring to FIGS. 1 and 2F, at step S600, the carrier C is removed. In some embodiments, after the conductive terminals 110 and the passive components 112 are mounted on the redistribution circuit structure 108, the dielectric layer DI formed on the bottom surface of the insulating encapsulation 106' is de-bonded from the de-bonding layer DB such that the dielectric layer DI is separated from the carrier C. That is, the carrier C is removed. In some embodiments, the de-bonding layer DB (e.g., the LTHC release layer) may be irradiated by an UV laser such that the dielectric layer DI adhered on the bottom surface of the insulating encapsulation 106' is peeled from the carrier C. As illustrated in FIG. 2F, the dielectric layer DI is then patterned such that a plurality of contact openings O is formed to partially expose the conductive posts 102. The number of the contact openings O corresponds to the number of the conductive posts 102. In some embodiments, the contact openings O of the dielectric layer DI are formed by a laser drilling process, a mechanical drilling process, or other suitable processes.

Figure 2G:
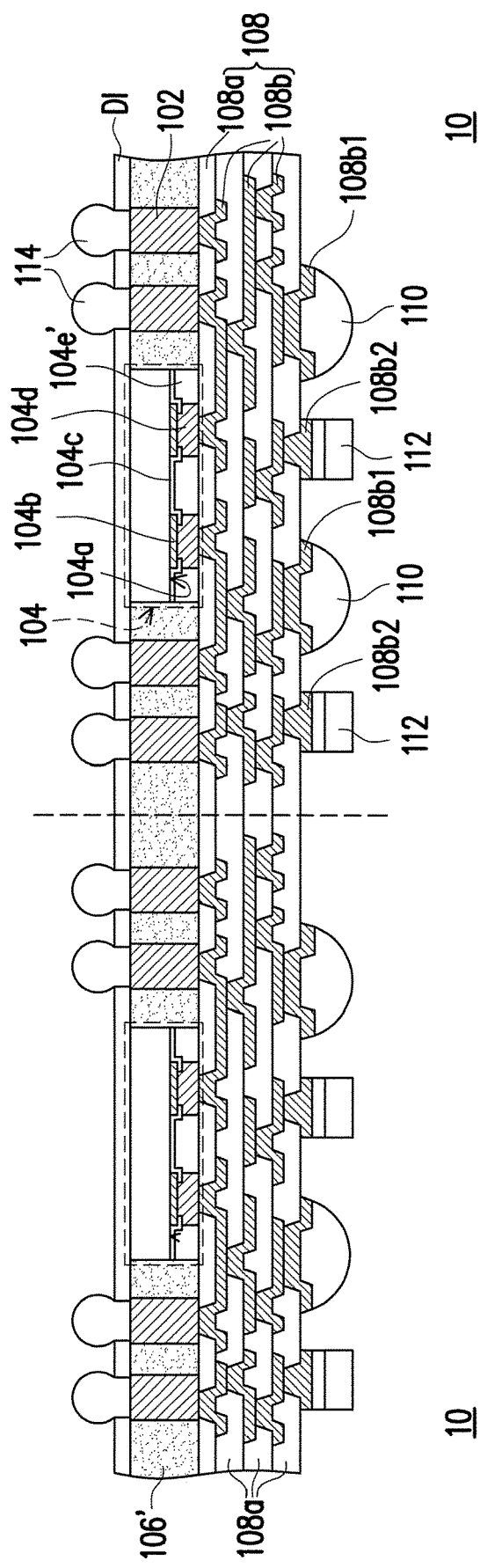

Referring to FIGS. 1 and 2G, at step S700, conductive terminals 114 are formed over a second side of the redistribution circuit structure 108 opposite to the first side, so as to form an INFO package 10. In some embodiments, after the contact openings O are formed in the dielectric layer DI, a plurality of conductive terminals 114 are placed in the contact openings O, and the conductive terminals 114 are electrically connected to the conductive posts 102. Herein, formation of an integrated fan-out (INFO) package array is substantially completed. As illustrated in FIG. 2G, after the conductive terminals 110 and the conductive terminals 114 are formed, the INFO package array is diced to form a plurality of INFO packages 10 having dual-side terminal design. In some embodiment, the dicing process or singulation process typically involves dicing with a rotating blade or a laser beam. In other words, the dicing or singulation process is, for example, a laser cutting process, a mechanical cutting process, or other suitable processes.

Figure 2H:
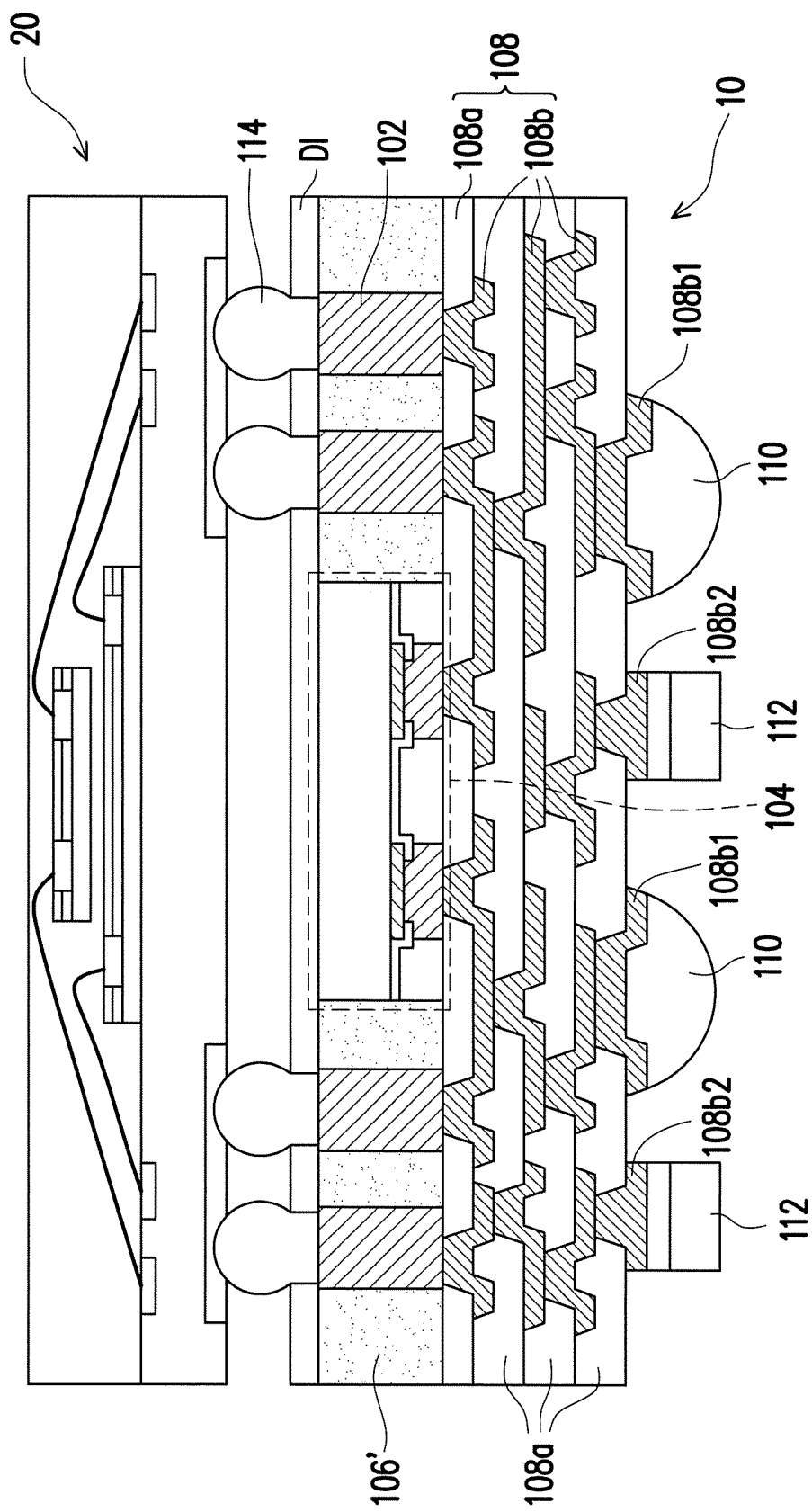
FIG. 2H is a cross-sectional view illustrating a package-on-package (PoP) structure in accordance with some embodiments of the disclosure.

FIG. 2H is a cross-sectional view illustrating a package-on-package (PoP) structure in accordance with some embodiments of the disclosure. In some embodiments, the INFO package 10 may be stack with other electronic devices. For example, referring to FIGS. 1 and 2H, at step S800, another package 20 is stacked over and electrically connected to the INFO package 10 through the conductive terminals 114, so as to form a package-on-package (PoP) structure. In some embodiments, the package 20 is, for example, an IC package. It should be noted that FIG. 2H merely serves as an exemplary illustration, and the disclosure is not limited thereto. In some alternative embodiments, the INFO package 10 may be stacked with other electronic devices such as another INFO package, a memory device, a ball grid array (BGA), or a wafer. Furthermore, the stacking may be performed preceding the dicing process. For example, the INFO package array illustrated in FIG. 2G may be stacked with a wafer, and the singulation process may be performed on the stacked INFO package array and the wafer simultaneously.

In accordance with some embodiments of the present disclosure, a redistribution circuit structure includes a first conductive structure, a dielectric layer and a second conductive structure. The dielectric layer is disposed over and exposes a portion of the first conductive structure. The second conductive structure is disposed in the dielectric layer to electrically connect to the first conductive structure, and includes a first conductive layer and a second conductive layer disposed on and electrically connected to the first conductive layer, wherein the first conductive layer includes an upper surface with a protrusion at an entire edge.

In accordance with alternative embodiments of the present disclosure, a redistribution circuit structure includes a first conductive structure, a dielectric layer and a second conductive structure. The dielectric layer is disposed over and exposes a portion of the first conductive structure. The second conductive structure is disposed in the dielectric layer to electrically connect to the first conductive structure, wherein an upper surface of the second conductive structure includes a step structure having at least three steps.

In accordance with yet alternative embodiments of the present disclosure, a method of forming a redistribution circuit structure includes the following steps. A dielectric layer is formed over a first conductive structure, wherein the dielectric layer includes a first opening to expose a portion of the first conductive structure. A first mask is formed over the dielectric layer to cover an upper portion of the first opening. By using the first mask as a mask, a first conductive layer is formed in the lower portion of the first opening. The first mask is removed. A second mask is formed over the dielectric layer without covering the first opening. By using the second mask as a mask, a second conductive layer is formed in the upper portion of the first opening on the first conductive layer, so as to form a second conductive structure comprising the first and second conductive layers. The second mask is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A redistribution circuit structure, comprising:
    a first conductive structure;
    a dielectric layer, disposed over and exposing a portion of the first conductive structure; and
    a second conductive structure, disposed in the dielectric layer to electrically connect to the first conductive structure, and comprising a first conductive layer and a second conductive layer disposed on and electrically connected to the first conductive layer, wherein the first conductive layer comprises a main portion and a conductive protrusion, the conductive protrusion is disposed on an entire edge of an upper surface of the main portion, and a top of the conductive protrusion is higher than the upper surface of the main portion.

2. The redistribution circuit structure of claim 1, wherein an outside wall of the conductive protrusion is substantially vertical to the upper surface of the main portion.

3. The redistribution circuit structure of claim 1, wherein an included angle between the upper surface of the main portion and an inside wall of the conductive protrusion is an obtuse angle.

4. The redistribution circuit structure of claim 1, wherein a portion of the second conductive layer further extends over the dielectric layer.

5. The redistribution circuit structure of claim 4, wherein a ratio of a thickness from a bottom of the first conductive layer to a lowest upper surface of the second conductive layer to a thickness of the portion of the second conductive layer extending over the dielectric layer is larger than 1.5.

6. The redistribution circuit structure of claim 4, wherein a total thickness of the dielectric layer and the portion of the second conductive layer thereon is two times larger than a width of the portion of the first conductive structure exposed by the dielectric layer.

7. The redistribution circuit structure of claim 1, wherein a distance from a lowest portion to a highest portion of the first conductive layer is substantially equal to a lowest portion to a highest portion of the second conductive layer.

8. The redistribution circuit structure of claim 1, wherein an interface is formed between the first conductive layer and the second conductive layer.

9. The redistribution circuit structure of claim 1 further comprising a barrier layer between the second conductive structure and the dielectric layer and between the second conductive structure and the first conductive structure.

10. The redistribution circuit structure of claim 1, wherein the main portion is integrated formed with the conductive protrusion.

11. The redistribution circuit structure of claim 1, wherein the upper surface of the main portion and the top of the conductive protrusion are covered by the second conductive layer.

12. A redistribution circuit structure, comprising:
    a first conductive structure;
    a dielectric layer, disposed over and exposing a portion of the first conductive structure;
    a second conductive structure, disposed in the dielectric layer to electrically connect to the first conductive structure, wherein an upper surface of the second conductive structure comprises a step structure having at least three steps; and
    a barrier layer, disposed between the second conductive structure and the dielectric layer and between the second conductive structure and the first conductive structure.

13. The redistribution circuit structure of claim 12, wherein the step structure comprises three steps.

14. The redistribution circuit structure of claim 12, wherein a ratio of a thickness from an upper surface of the first conductive structure to a lowest upper surface of the second conductive structure to a thickness of a portion of the second conductive structure over the dielectric layer is larger than 1.5.

15. The redistribution circuit structure of claim 12, wherein the dielectric layer has no step structure.

16. A method of forming a redistribution circuit structure, comprising:
    forming a dielectric layer over a first conductive structure, wherein the dielectric layer comprises a first opening to expose a portion of the first conductive structure;
    forming a first mask over the dielectric layer to cover an upper portion of the first opening;
    by using the first mask as a mask, forming a first conductive layer in a lower portion of the first opening;
    removing the first mask, wherein the first conductive layer comprises a main portion and a conductive protrusion, the conductive protrusion is disposed on an entire edge of an upper surface of the main portion, and a top of the conductive protrusion is higher than the upper surface of the main portion;

forming a second mask over the dielectric layer without covering the first opening;

by using the second mask as a mask, forming a second conductive layer in the upper portion of the first opening on the first conductive layer, so as to form a second conductive structure comprising the first and second conductive layers; and removing the second mask.

17. The method of claim 16 further comprising forming a barrier layer between the second conductive structure and the dielectric layer and between the second conductive structure and the first conductive structure.

18. The method of claim 16, wherein at least one third opening of the second mask is formed over the dielectric layer.

19. The method of claim 18, wherein the second conductive layer is further formed in the at least one third opening.

20. The method of claim 16, wherein a depth of the lower portion of the first opening is substantially equal to a depth of the upper portion of the first opening.

\* \* \* \* \*